United States Patent
Kawaguchi et al.

(10) Patent No.: US 8,264,867 B2
(45) Date of Patent: Sep. 11, 2012

(54) NONVOLATILE SEMICONDUCTOR STORAGE DEVICE

(75) Inventors: Kazuaki Kawaguchi, Kanagawa (JP); Takahiko Sasaki, Tokyo (JP); Tomonori Kurosawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 12/885,881

(22) Filed: Sep. 20, 2010

(65) Prior Publication Data

US 2011/0235392 A1    Sep. 29, 2011

(30) Foreign Application Priority Data

Mar. 24, 2010 (JP) ................................. 2010-067878

(51) Int. Cl.
*G11C 11/00* (2006.01)
(52) U.S. Cl. ............... 365/148; 365/189.15; 365/210.12
(58) Field of Classification Search .................. 365/148, 365/189.15, 210.12
See application file for complete search history.

(56) References Cited

U.S. PATENT DOCUMENTS 6,876,585 B2 * 4/2005 Choi et al. ............... 365/189.09
2008/0291716 A1   11/2008 Futatsuyama et al.

FOREIGN PATENT DOCUMENTS

| JP | 2004-30822 | 1/2004 |
| JP | 2007-73176 | 3/2007 |
| JP | 2008-282499 | 11/2008 |
| JP | 2008-287827 | 11/2008 |

OTHER PUBLICATIONS

U.S. Appl. No. 13/051,312, filed Mar. 18, 2011, Sasaki, et al.
U.S. Appl. No. 13/051,614, filed Mar. 18, 2011, Sasaki, et al.
U.S. Appl. No. 12/818,678, filed Jun. 18, 2010, Takahiko Sasaki.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a nonvolatile semiconductor storage device having a plurality of operation modes, includes: a plurality of first lines; a plurality of second lines; a plurality of memory cells; a first selection unit that charges the first line to a first selection voltage; and a second selection unit that charges a second line to an unselection voltage and discharges the second line to a second selection voltage after the first line is charged to the first selection voltage by the first selection unit, wherein the second selection unit adjusts at least one of a level of the second selection voltage to which the second line to be selected is to be discharged and a time constant when discharging the second line to be selected, in accordance with an operation mode in which the nonvolatile semiconductor storage device operates among the plurality of operation modes.

20 Claims, 8 Drawing Sheets

NONVOLATILE SEMICONDUCTOR STORAGE DEVICE

CROSS-REFERENCE TO RELATED APPLICATIONS

This application is based upon and claims the benefit of priority from the prior Japanese Patent Application No. 2010-067878, filed on Mar. 24, 2010; the entire contents of which are incorporated herein by reference.

FIELD

Embodiments described herein relate generally to a nonvolatile semiconductor storage device.

BACKGROUND

A resistive random access memory (ReRAM) is a nonvolatile semiconductor memory that uses a material whose resistance changes in accordance with a voltage and attracts attention as a replacement for a flash memory.

DETAILED DESCRIPTION

Figure 1:
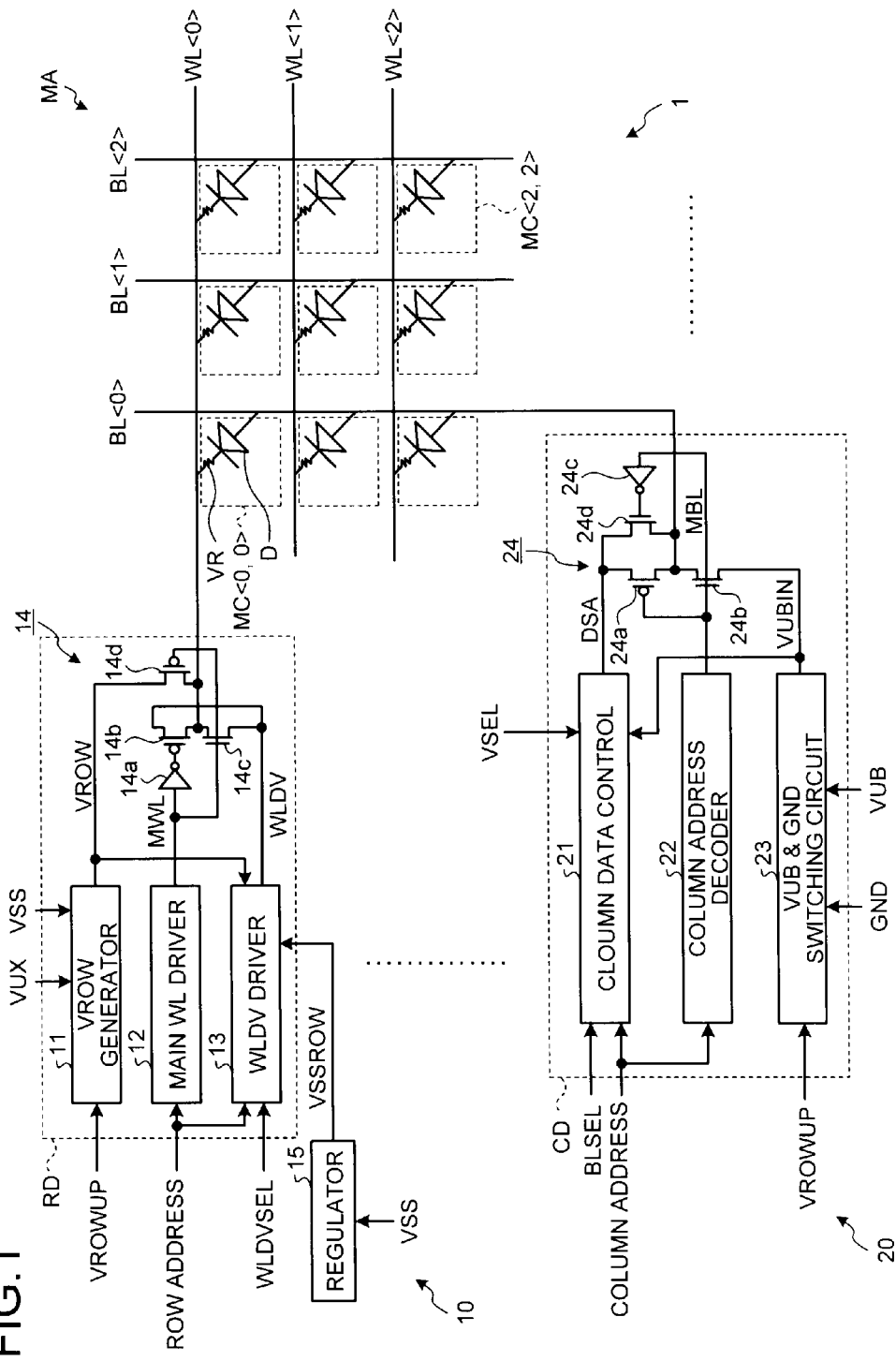
FIG. 1 is a diagram illustrating a configuration of a nonvolatile semiconductor storage device according to a first embodiment.

In this ReRAM, a voltage for causing an unselected word line to be in an unselected state is supplied to the unselected word line and a voltage for causing a selected word line to be in a selected state is supplied to the selected word line. Moreover, a voltage for causing an unselected bit line to be in the unselected state is supplied to the unselected bit line and a voltage for causing a selected bit line to be in the selected state is supplied to the selected bit line.

The operation (operation mode) of the ReRAM includes a forming operation for forming a variable resistive element in a memory cell into a low-resistance state at an initial performance, a set operation for switching the variable resistive element from a high-resistance state to the low-resistance state, a reset operation for switching the variable resistive element from the low-resistance state to the high-resistance state, and a read operation for checking whether the memory cell is in the set state or the reset state. In the ReRAM, changing between the above operations (operation modes) is realized by adjusting setting of a power supply voltage level to be supplied, setting of a compliance current (allowable current that can be supplied to the memory cell), operation time, and the like.

When the unselected word line and the selected bit line are discharged to a ground voltage regardless of the operation mode, sufficient stress is not applied to the memory cell in the operation mode where application of the stress to the memory cell arranged at a position at which the selected word line intersects with the selected bit line is required (such operation mode is, for example, the forming operation and the set operation). Therefore, the memory cell is not switched to a sufficiently low resistance state in some cases.

Moreover, when the unselected word line and the selected bit line are discharged to the ground voltage regardless of the operation mode, excess stress is applied to the memory cell in the operation mode where application of the stress to the memory cell arranged at a position at which the selected word line intersect with the selected bit line is not required (such operation mode is, for example, the read operation and the reset operation). Therefore, the memory cell is incorrectly switched to the low-resistance state in some cases, so that the memory cell may store incorrect information.

In general, according to one embodiment, there is provided a nonvolatile semiconductor storage device having a plurality of operation modes, comprising: a plurality of first lines; a plurality of second lines that intersect with the plurality of first lines; a plurality of memory cells arranged at positions where the first lines intersect with the second lines, each memory cell including a variable resistive element and a rectifying element that is connected to the variable resistive element in series; a first selection unit that charges a first line to be selected from among the plurality of first lines to a first selection voltage; and a second selection unit that charges a second line to be selected from among the plurality of second lines to an unselection voltage and discharges the second line to be selected to a second selection voltage after the first line to be selected is charged to the first selection voltage by the first selection unit, wherein the second selection unit adjusts at least one of a level of the second selection voltage to which the second line to be selected is to be discharged and a time constant when discharging the second line to be selected, in accordance with an operation mode in which the nonvolatile semiconductor storage device operates among the plurality of operation modes.

A nonvolatile semiconductor storage device according to exemplary embodiments will be explained below in detail with reference to the accompanying drawings. The scope of the present invention is not limited to these embodiments.

First Embodiment

The configuration of a nonvolatile semiconductor storage device 1 according to the first embodiment is explained with reference to FIG. 1.

The nonvolatile semiconductor storage device 1 includes a plurality of word lines (a plurality of second lines) WL<0> to WL<2>, a plurality of bit lines (a plurality of first lines) BL<0> to BL<2>, a plurality of memory cells MC<0,0> to MC<2,2>, a plurality of row control circuits (second selection units) 10, a plurality of column control circuits (first selection units) 20, and a mode control circuit (not shown). The nonvolatile semiconductor storage device 1 is, for example, an ReRAM.

The word lines WL<0> to WL<2> extend in a direction along a row between the memory cells MC<0,0> to MC<2,2>.

The bit lines BL<0> to BL<2> extend in a direction along a column between the memory cells MC<0,0> to MC<2,2>. The bit lines BL<0> to BL<2> intersect with the word lines WL<0> to WL<2>.

The memory cells MC<0,0> to MC<2,2> are arranged at positions at which the word lines WL<0> to WL<2> intersect with the bit lines BL<0> to BL<2>. The memory cells MC<0,0> to MC<2,2> are arranged in the direction along the row and the direction along the column to constitute a memory cell array MA. FIG. 1 illustrates a case in which the memory cell array MA is constituted by the memory cells of 3 rows×3 columns as an example.

Each memory cell MC includes a variable resistive element VR and a diode (rectifying element) D. The variable resistive element VR and the diode D are connected in series. The variable resistive element VR is connected to the word line WL at one end and is connected to the bit line BL at the other end via the diode D. The cathode of the diode D is connected to the word line WL via the variable resistive element VR and the anode of the diode D is connected to the bit line BL.

It should be noted that, although FIG. 1 illustrates the configuration of the memory cell MC in which the variable resistive element VR is arranged on the word line side and the diode D is arranged on the bit line side as an example, it is applicable that the variable resistive element VR is arranged on the bit line side and the diode D is arranged on the word line side.

In the variable resistive element VR, a low-resistance state is a written state (for example, "0") and a high-resistance state is an erased state (for example, "1"). In the following, a write operation of "1" for switching the memory cell MC from the low-resistance state to the high-resistance state is referred to as an erase (or reset) operation and a write operation of "0" for switching the memory cell MC from the high-resistance state to the low-resistance state is referred to as a write (or set) operation.

Each word line WL is connected to the row control circuit 10 of a corresponding row. Each bit line BL is connected to the column control circuit 20 of a corresponding column.

Each row control circuit 10 includes a row decoder RD and a regulator circuit 15. The row decoder RD includes a VROW generator 11, a main WL driver 12, a WLDV driver 13, and a row gate circuit 14.

The VROW generator 11 generates a VROW signal from a VROWUP signal as a core control signal. The main WL driver 12 generates an MWL signal from a row address signal.

The WLDV driver 13 generates a WLDV signal from a WLDVSEL signal as the core control signal, the VROW signal, a VSSROW signal, and the row address signal. The row gate circuit 14 includes a NOT circuit 14a, a P-channel type MOSFET 14b, an N-channel type MOSFET 14c, and a P-channel type MOSFET 14d. The MWL signal is input to the gate of the P-channel type MOSFET 14b via the NOT circuit 14a, so that a pair of the P-channel type MOSFET 14b and the N-channel type MOSFET 14c and a transistor of the P-channel type MOSFET 14d operate in a complementary manner based on a logical level of the MWL signal.

Upon receiving VSS of a GND level, the regulator circuit 15 generates a voltage VSSROW (i.e. the VSSROW signal) and supplies it to the WLDV driver 13. The internal configuration of the regulator circuit 15 is explained later.

Each column control circuit 20 includes a column decoder CD. The column decoder CD includes a column data control unit 21, a column address decoder 22, a VUB & GND switching circuit 23, and a column gate circuit 24. The column data control unit 21 generates a DSA signal from a BLSEL signal as the core control signal and a column address signal. The column address decoder 22 decodes the column address signal and outputs an MBL signal as the decode result. The VUB & GND switching circuit 23 supplies GND to VUBIN if the VROWUP is L and supplies VUB to VUBIN if the VROWUP is H. The column gate circuit 24 includes a P-channel type MOSFET 24a, an N-channel type MOSFET 24b, a NOT circuit 24c, and an N-channel type MOSFET 24d. The output of the column address decoder 22 is input to the gate of the N-channel type MOSFET 24d via the NOT circuit 24c, so that a pair of the P-channel type MOSFET 24a and the N-channel type MOSFET 24d and a transistor of the N-channel type MOSFET 24b operate in a complementary manner based on a logical level of the MBL signal output from the column address decoder 22.

The mode control circuit controls an operation mode in which the nonvolatile semiconductor storage device 1 is performed among a plurality of operation modes that the nonvolatile semiconductor storage device 1 has.

Specifically, in the case of causing the nonvolatile semiconductor storage device 1 to perform in the operation mode of a forming operation for forming the variable resistive element VR in the memory cell MC into the low-resistance state at an initial performance, the mode control circuit sets a FORMING signal to an active level (for example, H level) and outputs it. At this time, the mode control circuit sets others signals (SET signal, RESET signal, and READ signal) to a nonactive level (for example, L level).

Alternatively, in the case of causing the nonvolatile semiconductor storage device 1 to perform in the operation mode of a set operation for switching the variable resistive element VR in the memory cell MC from the high-resistance state to the low-resistance state, the mode control circuit sets the SET signal to the active level (for example, H level) and outputs it. At this time, the mode control circuit sets others signals (FORMING signal, RESET signal, and READ signal) to the nonactive level (for example, L level).

Alternatively, in the case of causing the nonvolatile semiconductor storage device 1 to perform in the operation mode of a reset operation for switching the variable resistive element VR in the memory cell MC from the low-resistance state to the high-resistance state, the mode control circuit sets the RESET signal to the active level (for example, H level) and outputs it. At this time, the mode control circuit sets others signals (FORMING signal, SET signal, and READ signal) to the nonactive level (for example, L level).

Alternatively, in the case of causing the nonvolatile semiconductor storage device 1 to perform in the operation mode of a read operation for checking whether the memory cell MC is in the set state or the reset state, the mode control circuit sets the READ signal to the active level (for example, H level) and outputs it. At this time, the mode control circuit sets others signals (FORMING signal, SET signal, and RESET signal) to the nonactive level (for example, L level).

Figure 2:
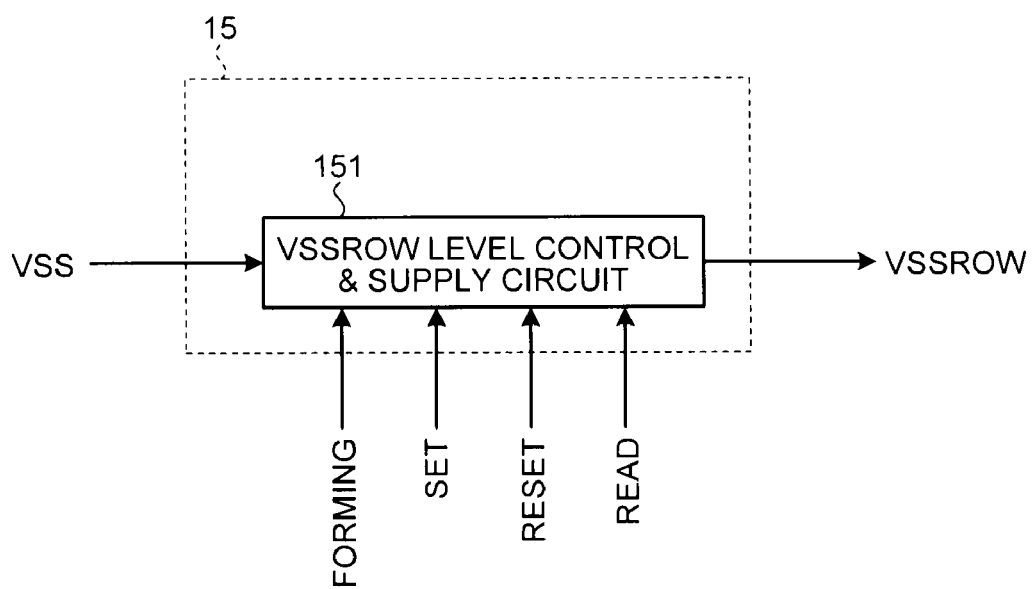
FIG. 2 is a diagram illustrating a configuration of a regulator circuit according to the first embodiment.

With reference to FIG. 2 the internal configuration of the regulator circuit 15 is explained.

The regulator circuit 15 includes a circuit 151 for performing control and supply of the VSSROW level. The circuit 151 controls the level of the voltage VSSROW to be supplied to the selected word line. Specifically, the circuit 151 receives the ground voltage VSS from a power supply circuit (not shown) and receives the FORMING signal, the SET signal, the RESET signal, and the READ signal from the mode control circuit. The circuit 151 detects the operation mode in which the nonvolatile semiconductor storage device 1 operates, depending on which signal is at the active level among the FORMING signal, the SET signal, the RESET signal, and the READ signal received from the mode control circuit. The circuit 151 generates the voltage VSSROW by shifting the level of the ground voltage VSS by a shift amount in accordance with the detected operation mode and outputs it.

For example, when the READ signal is at the active level, the circuit 151 generates the voltage VSSROW having a voltage value V1 by shifting the level of the ground voltage VSS by a shift amount V1 and outputs it.

For example, when the RESET signal is at the active level, the circuit 151 generates the voltage VSSROW having a voltage value V2 by shifting the level of the ground voltage VSS by a shift amount V2 (<V1) and outputs it.

For example, when the SET signal is at the active level, the circuit 151 generates the voltage VSSROW having a voltage value V3 by shifting the level of the ground voltage VSS by a shift amount V3 (<V2) and outputs it.

For example, when the FORMING signal is at the active level, the circuit 151 generates the voltage VSSROW having a voltage value V4 by shifting the level of the ground voltage VSS by a shift amount V4 (<V3) and outputs it.

Figure 3:
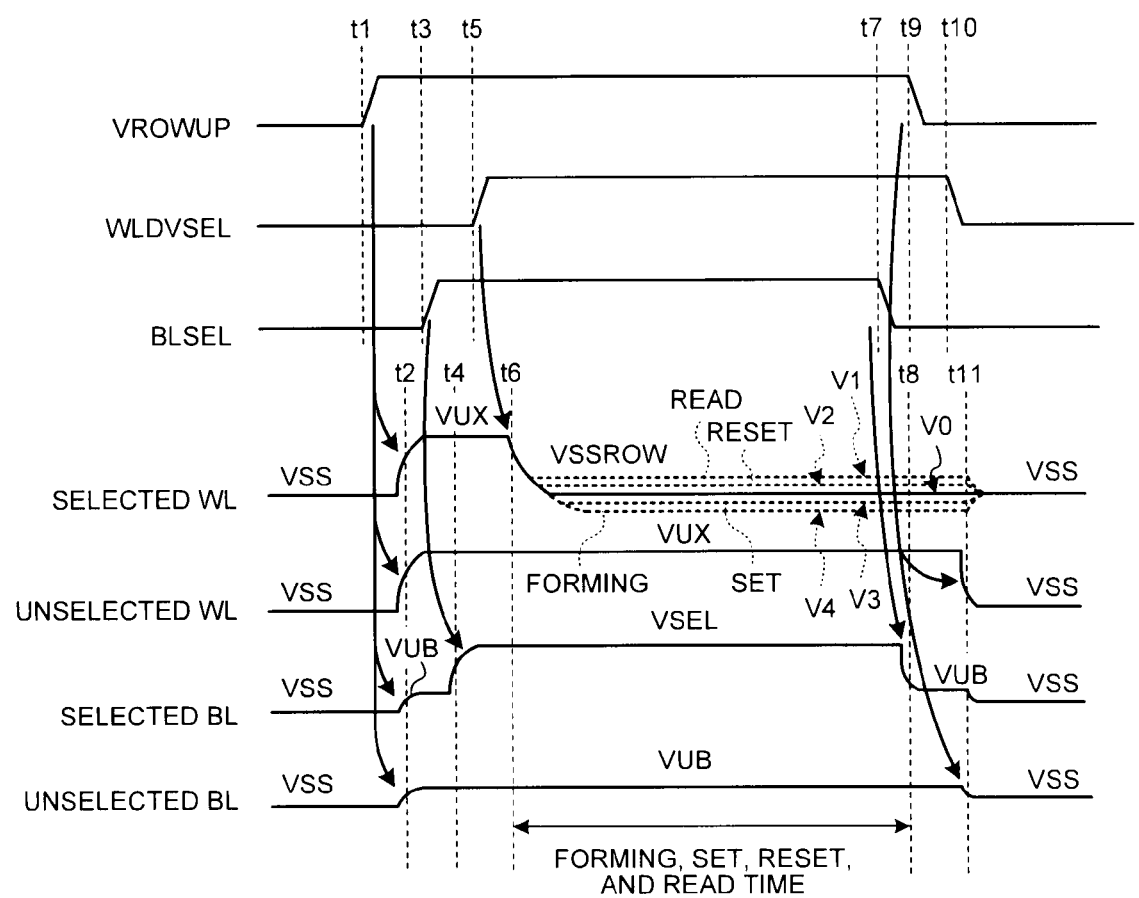
FIG. 3 is a waveform diagram illustrating an operation of the nonvolatile semiconductor storage device according to the first embodiment.

With reference to FIG. 3, the operation of the nonvolatile semiconductor storage device 1 according to the first embodiment is explained. FIG. 3 illustrates an operation waveform diagram of activation/nonactivation of the word line WL and the bit line BL based on change of the core control signals (VROWUP, WLDVSEL, and BLSEL) shown in FIG. 1.

FIG. 3 illustrates, as an example, a WL last waveform in which the selected word line (second line to be selected) WL is activated after the selected bit line (first line to be selected) BL is activated. The VROWUP signal is a signal for performing a control of all of the word lines WL and all of the bit lines BL, the WLDVSEL signal is a signal for performing a control of the selected word line WL, and the BLSEL signal is a signal for performing a control of the selected bit line BL.

Upon receiving the VROWUP signal and the WLDVSEL signal shown in FIG. 3, the row control circuit 10 of a selected row controls the level of the selected word line WL to the level indicated in a "selected WL" in FIG. 3.

Upon receiving the VROWUP signal shown in FIG. 3 and a WLDVSEL signal maintained at the L level (not-shown in FIG. 3), the row control circuit 10 of an unselected row controls the level of the unselected word line WL to the level indicated in an "unselected WL" in FIG. 3.

Upon receiving the VROWUP signal and the BLSEL signal shown in FIG. 3, the column control circuit 20 of a selected column controls the level of the selected bit line BL to the level indicated in a "selected BL" in FIG. 3.

Upon receiving the VROWUP signal shown in FIG. 3 and a BLSEL signal maintained at the L level (not-shown in FIG. 3), the column control circuit 20 of an unselected column controls the level of the unselected bit line BL to the level indicated in an "unselected BL" in FIG. 3.

In an initial state, i.e., in the period immediately before a timing t1, all of the word lines WL and the bit lines BL are set to the ground (GND) voltage VSS.

At the timing t1, all of the word lines WL are selected by the row address signals, and thereby the VROWUP signal is switched from L to H.

At a timing t2, in response to a situation that the VROWUP signal has been switched to H (switched at the timing t1), all of the word lines WL (selected WL and unselected WL) are set to a voltage (unselection voltage) VUX that is equal to or larger than a threshold voltage Vth of the diode D, and all of the bit lines BL are raised to a voltage VUB (VSS<VUB<VSEL). Specifically, the MWL signals that is output from the main WL drivers 12 of all of the row decoders RD are set to L by applying the row address signals that select all of the word lines WL, and all of the word lines WL are set to H by the P-channel type MOSFETs 14d of all of the row decoders RD. In other words, the row control circuits 10 charge all of the word lines WL collectively (e.g. at the same time) to the unselection voltage VUX, and the column control circuits 20 charge all of the bit lines BL to the intermediate voltage VUB.

At a timing t3, a desired bit line BL is selected by the column address and the BLSEL signal is switched from L to H.

At a timing t4, in response to a situation that the BLSEL signal has been switched to H, the selected bit line BL is selectively raised to a voltage (first selection voltage) VSEL that is equal to or larger than the threshold voltage Vth of the diode D. Specifically, the MBL signal that is output from the column address decoder 22 of the column control circuit 20 corresponding to the selected bit line BL is set to L by applying the column address signal that selects the desired bit line BL to turn on the P-channel type MOSFET 24a and the N-channel type MOSFET 24d. When the BLSEL signal is switched to H, the selected bit line BL is selectively switched to H by the P-channel type MOSFET 24a and the N-channel type MOSFET 24d. In other words, the column control circuit 20 of the selected column charges the selected bit line BL from the intermediate voltage VUB to the selection voltage VSEL. At this time, the column control circuit 20 of the unselected column keeps the unselected bit line BL in the intermediate voltage VUB.

At a timing t5, a desired word line WL is selected by the row address signal, and thereby the WLDVSEL signal is switched from L to H.

At a timing t6, in response to a situation that the WLDVSEL signal has been switched to H, the selected word line WL is selectively discharged to the voltage (second selection voltage) VSSROW. Specifically, the MWL signal output from the main WL driver 12 of the row decoder RD corresponding to the selected word line WL is switched to H by applying the row address signal that selects the desired word line WL to turn on the P-channel type MOSFET 14b and the N-channel type MOSFET 14c of the row decoder RD corresponding to the selected word line WL. When the WLDVSEL is switched to H, the level of the selected word line WL selectively falls to the voltage VSSROW by the P-channel type MOSFET 14b and the N-channel type MOSFET 14c. In other words, the row control circuit 10 of the selected row discharges the selected word line WL from the unselection voltage VUX to the selection voltage VSSROW. At this time, the row control circuit 10 of the unselected row keeps the unselected word line WL at the unselection voltage VUX.

In this discharging, as described above, in the forming operation (first operation mode) in which application of the stress to the memory cell is needed the most, the circuit 151 that performs control and supply of the VSSROW level in the regulator circuit 15 sets the level of the voltage VSSROW to a level V4 that is the lowest among V1 to V4. The level V4 is, for example, a level that is lower than a level V0 of the ground voltage VSS.

In the set operation (first operation mode) in which application of the stress to the memory cell is needed next to the forming operation, the circuit 151 sets the level of the voltage VSSROW to the level V3 (>V4) that is higher than the forming operation among the V1 to V4. The level V3 is, for example, a level that is lower than the level V0 of the ground voltage VSS.

In the reset operation (second operation mode) in which application of the stress to the memory cell is needed next to the set operation (i.e. application of the stress to the memory cell is not needed in comparison to the set operation), the circuit 151 sets the level of the voltage VSSROW to the level V2 (>V3) that is higher than the set operation. The level V2 is, for example, a level that is higher than the level V0 of the ground voltage VSS.

In the read operation (second operation mode) in which application of the stress to the memory cell is not needed (in comparison to the reset operation), the circuit 151 sets the voltage VSSROW to the highest level V1. The level V1 is, for example, a level that is higher than the level V0 of the ground voltage VSS.

After completion of such an access operation, the BLSEL signal is switched from H to L at a timing t7.

At a timing t8, in response to a situation that the BLSEL signal has been switched to L, the selected bit line BL is lowered from the selection voltage VSEL to the intermediate voltage VUB. In other words, the column control circuit 20 of the selected column discharges the selected bit line BL from the selection voltage VSEL to the intermediate voltage VUB. At this time, the column control circuit 20 of the unselected column keeps the unselected bit line BL at the intermediate voltage VUB.

At a timing t9, the VROWUP signal is switched from H to L. Then, at a timing t10, the WLDVSEL signal is switched from H to L.

At a timing t11, all of the word lines WL and all of the bit lines BL are set (i.e. lowered or raised) to the ground voltage VSS. In other words, the row control circuit 10 of the selected row discharges or charges the selected word line WL from the selection voltage VSSROW to the ground voltage VSS. The row control circuit 10 of the unselected row discharges the unselected word line WL from the unselection voltage VUX to the ground voltage VSS. The column control circuit 20 of the selected column discharges the selected bit line BL from the intermediate voltage VUB to the ground voltage VSS. The column control circuit 20 of the unselected column discharges the unselected bit line BL from the unselection voltage VUB to the ground voltage VSS.

In this manner, in the nonvolatile semiconductor storage device 1 (ReRAM), in the activation/nonactivation of the word line WL and the bit line BL, the operations of three stages of (1) to (3), i.e., (1) switching of all of the word lines WL from L to H, (2) switching of the selected bit line BL from L to H, and (3) switching of the selected word line WL from H to L are performed at the time of activation. At the stage (3), the operation mode in which the nonvolatile semiconductor storage device 1 operates is detected from among the forming operation, the reset operation, the set operation, and the read operation, and the voltage VSSROW of the level appropriate for the detected operation mode is supplied to the selected word line WL. Moreover, at the time of precharge (nonactivation), the operations of two stages of (1') and (2'), i.e., (1') switching of the selected bit line BL from H to L and (2') switching of the unselected word line WL from H to L are employed. With these controls, it becomes possible to apply the stress close to an ideal stress to the memory cell, enabling to realize a stable operation of the memory cell.

As above, according to the first embodiment, the level of the selection voltage (second selection voltage) VSSROW to which the selected word line is to be discharged is adjusted to a value (for example, any value of V1 to V4) appropriate for the operation mode, in accordance with the operation mode where the nonvolatile semiconductor storage device 1 operates detected from among the plurality of operation modes (including the forming operation, the reset operation, the set operation, and the read operation). At this time, the selected bit line is set to the selection voltage (first selection voltage) VSEL. Whereby, it is possible to apply, as an appropriate stress in accordance with the operation mode, a differential voltage between the selection voltage (second selection voltage) VSSROW and the selection voltage (first selection voltage) VSEL to the memory cell arranged at a position where the selected bit line intersects with the selected word line. In this manner, the cell access operation such as the forming operation, the set operation, the reset operation, and the read operation can be performed by applying the stress close to an ideal stress with respect to any selected memory cell.

In other words, the operation modes include the first operation mode (e.g. forming operation and set operation) in which application of the stress to the memory cell is required and the second operation mode (e.g. reset operation and read operation) in which application of the stress to the memory cell is not required. The row control circuit 10 of the selected row adjusts the level of the selection voltage (second selection voltage) VSSROW to which the selected word line is to be discharged, such that the level of the selection voltage VSSROW in the second mode becomes close to the level of the unselection voltage VUX (e.g. V4 (or V3)<V2 (or V1)<VUX) compared with the first operation mode. Whereby, in the first operation mode (forming operation and set operation) where application of the stress to the memory cell is required, sufficient stress can be applied to the memory cell. Consequently, the memory cell can be switched to a sufficiently low resistance state. Moreover, in the second operation mode (reset operation and read operation) where application of the stress to the memory cell is not required, application of excess stress to the memory cell can be suppressed. Consequently, since incorrect switching of the memory cell into the low-resistance state can be reduced, it is possible to keep the memory cell from storing incorrect information.

It should be noted that, although FIG. 1 illustrates the memory cell arrangement in which the diode D in the memory cell MC is forward-biased when a positive bias is provided to the bit line BL, it is possible to employ the memory cell arrangement in which the diode (rectifying element) in the memory cell is forward-biased when a positive bias is provided to the word line WL. In this case, the regulator circuit 15 is included in the column control circuit 20 instead of in the row control circuit 10. At this time, the regulator circuit 15 supplies the voltage VSSCOLUMN (corresponding to VSSROW) to the column data control unit 21 in the column decoder CD. Moreover, the operation waveform becomes approximately equal to the one in which the "selected WL" and the "selected BL" are interchanged and the "unselected WL" and the "unselected BL" are interchanged.

In other words, the row control circuits (first selection units) 10 charge the selected word line (first line to be selected) WL among the word lines (first lines) WL to the selection voltage (first selection voltage) VSEL. The column control circuits (second selection units) 20 charge the selected bit line (second line to be selected) BL among the bit lines (second lines) BL to the unselection voltage VUX and discharge the selected bit line BL to a selection voltage (second selection voltage) VSSCOLUMN after the selected word line is charged to the selection voltage VSEL by the row control circuit 10 of the selected row. At this time, the column control circuits 20 adjust the level of the selection voltage VSSCOLUMN to which the selected bit line BL is to be discharged in accordance with the operation mode in which the nonvolatile semiconductor storage device 1 operates among the operation modes. The level of the voltage VSSCOLUMN is set in the similar manner to the level of the VSSROW in the first embodiment.

Second Embodiment

A nonvolatile semiconductor storage device 1*i* according to the second embodiment is explained. In the followings, a portion different from the first embodiment is mainly explained.

Figure 4:
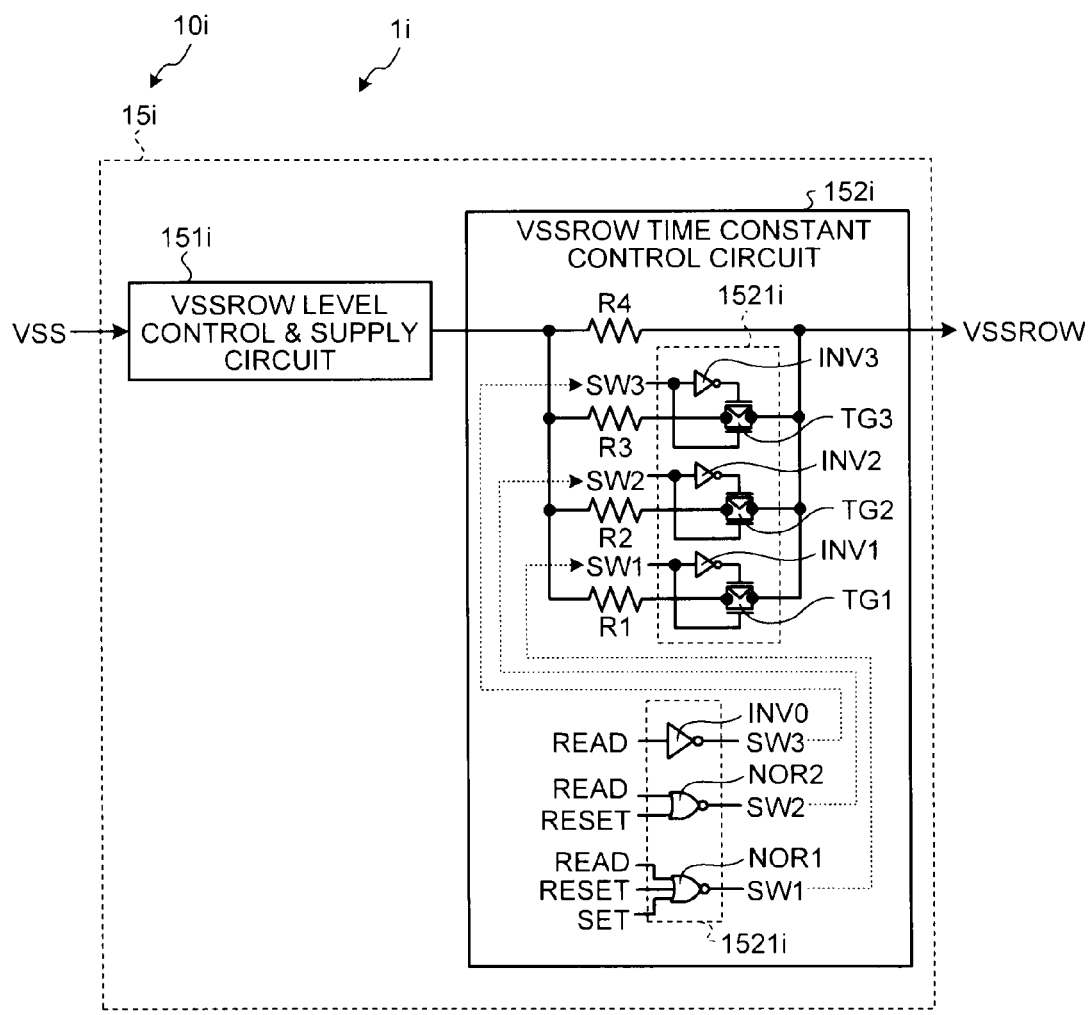
FIG. 4 is a diagram illustrating a configuration of a regulator circuit according to a second embodiment.

In the nonvolatile semiconductor storage device 1*i*, an internal configuration of a regulator circuit 15*i* in each row control circuit 10*i* is different from the first embodiment. FIG. 4 illustrates the internal configuration example of the regulator circuit 15*i*.

The regulator circuit 15*i* includes a circuit 151*i* that performs control and supply of the VSSROW level and a circuit 152*i* that performs control of a time constant of the VSSROW.

Upon receiving the ground voltage VSS, the circuit 151*i* generates the voltage VSSROW having a voltage value V0 approximately equal to the ground voltage VSS and outputs it to the circuit 152*i*.

The circuit 152*i* receives the voltage VSSROW from the circuit 151*i* and transfers it to the WLDV driver 13 of the decoder RD. Together with this, the circuit 152*i* receives the SET signal, the RESET signal, and the READ signal from the mode control circuit, and determines a resistive element to be used for adjusting the time constant, and connects the determined resistive element(s) to the WLDV driver 13 of the row decoder RD in accordance with these signals. Whereby, the row control circuit 10*i* of the selected row adjusts the time constant when discharging the selected word line WL from the unselection voltage VUX to the selection voltage VSSROW.

Specifically, the circuit 152*i* includes a plurality of resistive elements R1 to R4 and a selection circuit 1521*i*. The selection circuit 1521*i* selects at least one of the resistive elements R1 to R4 to be used when discharging the selected word line WL from the unselection voltage VUX to the selection voltage VSSROW from among the resistive elements R1 to R4. In other words, the selection circuit 1521*i* selects at least one resistive element to be used, such that the combined resistance of the resistive elements selected in the first operation mode becomes a first value and the combined resistance of the resistive elements selected in the second operation mode becomes a second value larger than the first value.

More specifically, the selection circuit 1521*i* includes NOR gates NOR1 and NOR2, inverters INV0 to INV3, and transfer gates TG1 to TG3.

The NOR gate NOR1 performs a NOR operation of the READ signal, the RESET signal, and the SET signal, and outputs the result thereof to the inverter INV1 and the transfer gate TG1 as a SW1 signal. The SW1 signal becomes the H level when all of the READ signal, the RESET signal, and the SET signal are at the L level (i.e., when the FORMING signal is at the H level), and becomes the L level in other cases. The transfer gate TG1 is turned on when the SW1 signal is at the H level to select the resistor R1 and connect the resistor R1 to the resistor R4 in parallel. The transfer gate TG1 is off when the SW1 signal is at the L level.

The NOR gate NOR2 performs the NOR operation of the READ signal and the RESET signal and outputs the result thereof to the inverter INV2 and the transfer gate TG2 as a SW2 signal. The SW2 signal becomes the H level when both of the READ signal and the RESET signal are at the L level (i.e., when the FORMING signal or the SET signal is at the H level), and becomes the L level in other cases. The transfer gate TG2 is turned on when the SW2 signal is at the H level to select the resistor R2 and connect the resistor R2 to the resistor R4 in parallel. The transfer gate TG2 is off when the SW2 signal is at the L level.

The inverter INV0 performs a NOT operation of the READ signal and outputs the result thereof to the inverter INV3 and the transfer gate TG3 as a SW3 signal. The SW3 signal becomes the H level when the READ signal is at the L level (i.e., when the FORMING signal, the SET signal, or the RESET signal is at the H level), and becomes the L level in other cases. The transfer gate TG3 is turned on when the SW3 signal is at the H level to select the resistor R3 and connect the resistor R3 to the resistor R4 in parallel. The transfer gate TG3 is off when the SW3 signal is at the L level.

In this manner, the circuit 152*i* includes the resistors R1 to R4, the transfer gates TG1 to TG3, and the control circuit thereof. The circuit 152*i* receives the SET signal, the RESET signal, and the READ signal from the mode control circuit. The circuit 152*i* detects the operation mode in which the nonvolatile semiconductor storage device 1*i* operates in accordance with which signal is at the active level among the SET signal, the RESET signal, and the READ signal received from the mode control circuit. In other words, the circuit 152*i* controls on/off of the transfer gates TG1 to TG3 in accordance with which signal is at the active level among the SET signal, the RESET signal, and the READ signal, and switches the time constant when discharging the selected word line WL from the unselection voltage VUX to the selection voltage VSSROW.

Figure 5:
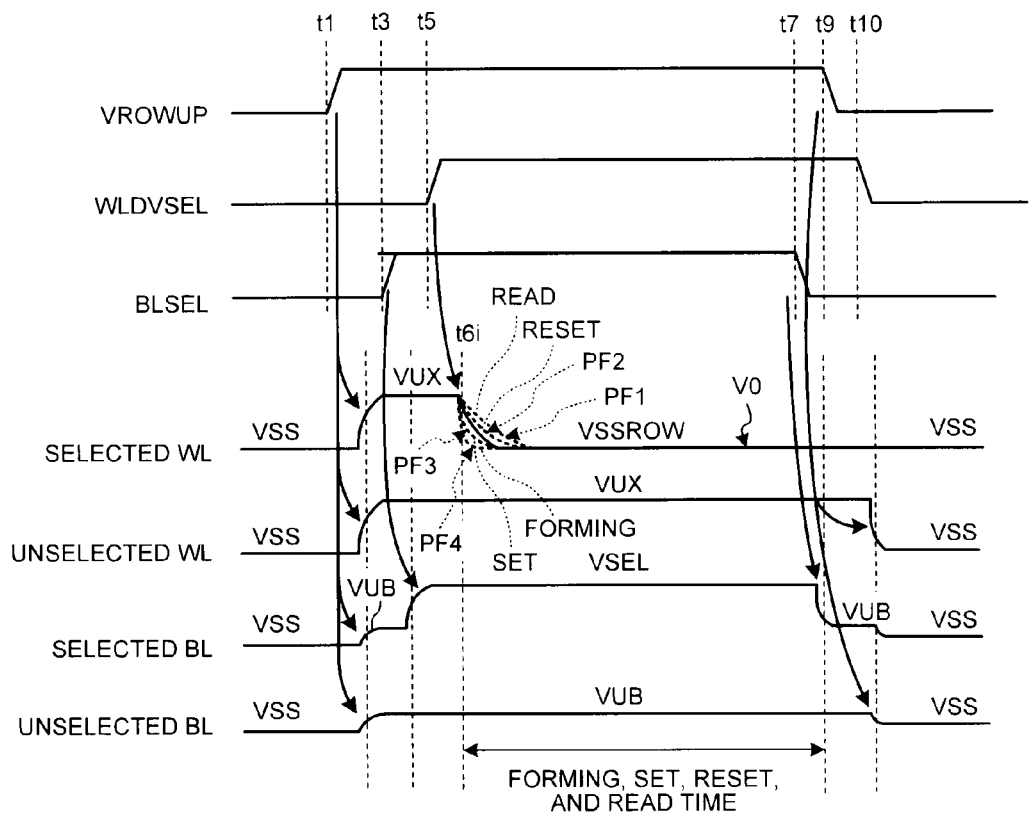
FIG. 5 is a waveform diagram illustrating an operation of a nonvolatile semiconductor storage device according to the second embodiment.

The operation of the nonvolatile semiconductor storage device 1*i* according to the second embodiment is explained with reference to FIG. 5. In the followings, a portion different from the operation shown in FIG. 3 is mainly explained.

At a timing t6*i*, in response to a situation that the WLDVSEL signal has become H (switched at the timing t5), the selected word line WL is selectively discharged to the voltage (second selection voltage) VSSROW. At this discharging, as described above, the circuit 152*i* that performs control of the time constant of the VSSROW in the regulator circuit 15*i* turns on all of the transfer gates TG1 to TG3 in the forming operation (first operation mode) in which application of the stress to the memory cell is needed the most. Therefore, because the combined resistance of the four resistors R1 to R4 connected in parallel contributes to the setting of the time constant, the time constant is set to the minimum. Whereby, the profile of the operation waveform when discharging the selected word line WL from the unselection voltage VUX to the selection voltage VSSROW becomes a profile PF4 (see FIG. 5) whose change is drastic.

The circuit 152*i* turns on the two transfer gates TG2 and TG3 and turns off the transfer gate TG1 in the set operation (first operation mode) in which application of the stress to the memory cell is needed next to the forming operation. Therefore, because the combined resistance of the three resistors R2 to R4 connected in parallel contributes to the setting of the time constant, the time constant is set larger than the forming operation. Whereby, the profile of the operation waveform when discharging the selected word line WL from the unselection voltage VUX to the selection voltage VSSROW becomes a profile PF3 (see FIG. 5) whose change is moderate compared with the profile PF4.

The circuit 152*i* turns on one transfer gate TG3 and turns off the transfer gates TG1 and TG2 in the reset operation (second operation mode) in which application of the stress to the memory cell is needed next to the set operation. Therefore, because the combined resistance of the two resistors R3 and R4 connected in parallel contributes to the setting of the time constant, the time constant is set larger than the set operation. Whereby, the profile of the operation waveform when discharging the selected word line WL from the unselection voltage VUX to the selection voltage VSSROW becomes a profile PF2 (see FIG. 5) whose change is moderate compared with the profile PF3.

The circuit 152i turns off all of the transfer gates TG1 to TG3 in the read operation (second operation mode) in which application of the stress to the memory cell is needed the least. Therefore, because one resistor R4 contributes to the setting of the time constant, the time constant is set the largest. Whereby, the profile of the operation waveform when discharging the selected word line WL from the unselection voltage VUX to the selection voltage VSSROW becomes a profile PF1 (see FIG. 5) whose change is moderate compared with the profile PF2.

As described above, according to the second embodiment, the time constant when discharging the selected word line is adjusted to a value appropriate for the operation mode, in accordance with the operation mode where the nonvolatile semiconductor storage device 1i operates detected from among the plurality of operation modes (including the forming operation, the reset operation, the set operation, and the read operation). At this time, the selected bit line is set to the selection voltage (first selection voltage) VSEL. Whereby, it is possible to apply, as an appropriate instantaneous stress in accordance with the operation mode, a differential voltage between the selection voltage (second selection voltage) VSSROW and the selection voltage (first selection voltage) VSEL to the memory cell that is arranged at the position where the selected bit line intersects with the selected word line. In this manner, the cell access operation such as the forming operation, the set operation, the reset operation, and the read operation can be performed by applying the instantaneous stress close to an ideal instantaneous stress with respect to any selected memory cell.

In other words, the operation modes include the first operation mode (e.g. forming operation and set operation) in which application of the stress to the memory cell is required and the second operation mode (e.g. reset operation and read operation) in which application of the stress to the memory cell is not required. The row control circuit 10 of the selected row adjusts the time constant, such that the time constant when discharging the selected word line in the second operation mode becomes large compared with the first operation mode. Whereby, in the first operation mode (forming operation and set operation) in which application of the instantaneous stress to the memory cell is required, sufficient instantaneous stress can be applied to the memory cell. Consequently, the memory cell can be switched to a sufficiently low resistance state. Moreover, in the second operation mode (reset operation and read operation) in which application of the instantaneous stress to the memory cell is not required, application of excess instantaneous stress to the memory cell can be suppressed. Consequently, since incorrect switching of the memory cell into the low-resistance state can be reduced, is possible to keep the memory cell from storing incorrect information.

It is applicable that the circuit 151i that performs control and supply of the VSSROW level in each row control circuit 10i performs the operation similar to the circuit 151 in the first embodiment. In other words, the circuit 151i can adjust the level of the selection voltage (second selection voltage) VSSROW to which the selected word line is to be discharged to a value (for example, any value of V1 to V4) appropriate for the operation mode in accordance with the operation mode where the nonvolatile semiconductor storage device 1i operates.

In this case, specifically, the circuit 151i receives the ground voltage VSS from a power supply circuit (not shown) and receives the FORMING signal, the SET signal, the RESET signal, and the READ signal from the mode control circuit. The circuit 151i detects the operation mode in which the nonvolatile semiconductor storage device 1i operates depending on which signal is at the active level among the FORMING signal, the SET signal, the RESET signal, and the READ signal received from the mode control circuit. The circuit 151i generates the voltage VSSROW by shifting the level of the ground voltage VSS by a shift amount in accordance with the detected operation mode and outputs it to the circuit 152i.

Figure 6:
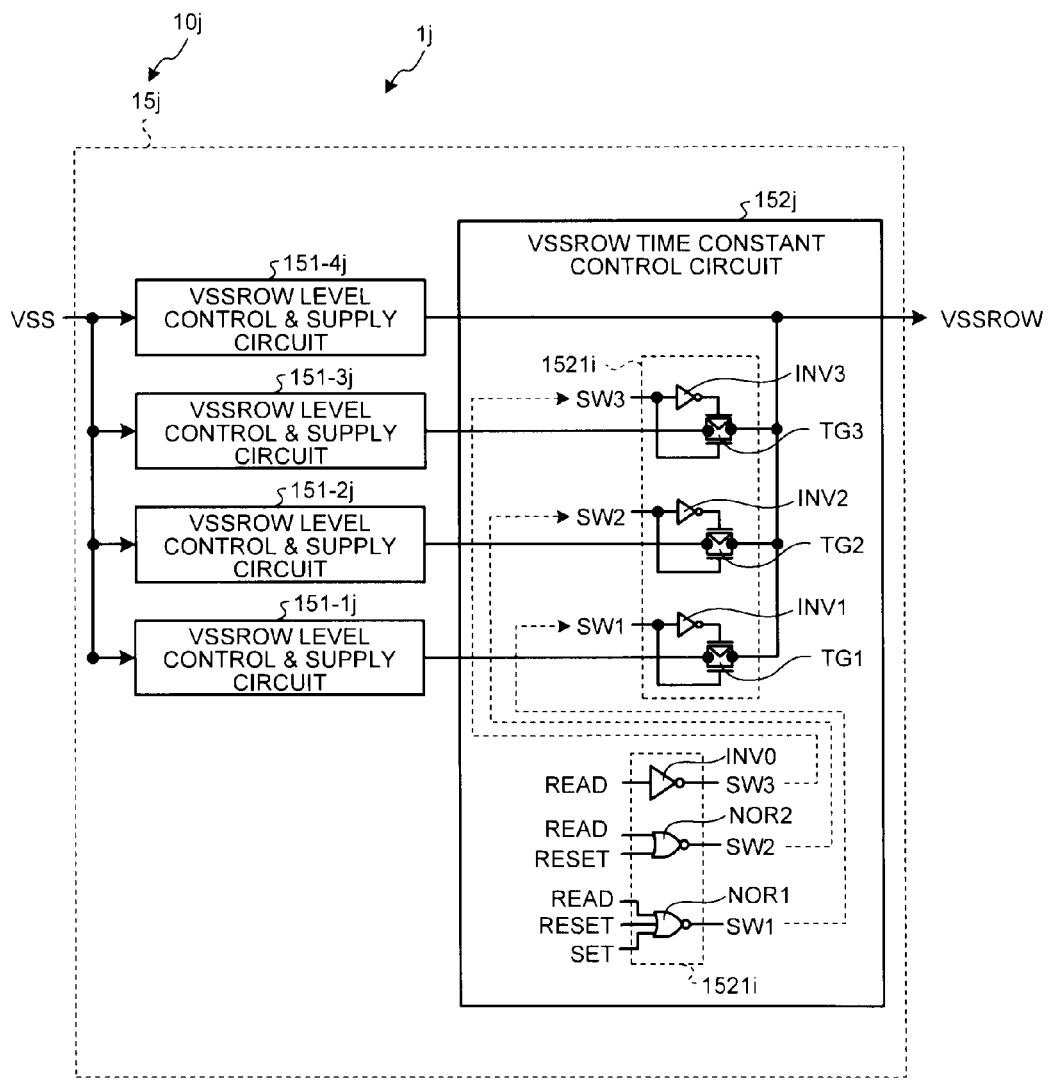
FIG. 6 is a diagram illustrating a configuration of a regulator circuit in a modified example of the second embodiment.

Alternatively, a regulator circuit 15j in a row control circuit 10j in a nonvolatile semiconductor storage device 1j can have a configuration shown in FIG. 6. The regulator circuit 15j shown in FIG. 6 includes a plurality of circuits 151-1j to 151-4j that performs control and supply of the VSSROW level and a circuit 152j that performs control of the time constant of the VSSROW. The circuit 152j does not include the resistive elements R1 to R4. In other words, the selection circuit 1521i in the circuit 152j determines the number of the VSSROW level control & supply circuits to be used. Then, the selection circuit 1521i in the circuit 152j selects at least one equivalent resistor to be used when discharging the selected word line WL from the unselection voltage VUX to the selection voltage VSSROW from among equivalent resistors R151-1j to R151-4j (not shown) included in the circuits 151-1j to 151-4j.

The circuit 152j turns on all of the transfer gates TG1 to TG3 in the forming operation (first operation mode) in which application of the stress to the memory cell is needed the most. Therefore, because the combined resistance of the four equivalent resistors R151-1j to R151-4j connected in parallel contributes to the setting of the time constant, the time constant is set to the minimum.

The circuit 152j turns on the two transfer gates TG2 and TG3 and turns off the transfer gate TG1 in the set operation (first operation mode) in which application of the stress to the memory cell is needed next to the forming operation. Therefore, because the combined resistance of the three equivalent resistors R151-2j to R151-4j connected in parallel contributes to the setting of the time constant, the time constant is set larger than the forming operation.

The circuit 152j turns on one transfer gate TG3 and turns off the transfer gates TG1 and TG2 in the reset operation (second operation mode) in which application of the stress to the memory cell is needed next to the set operation. Therefore, because the combined resistance of the two equivalent resistors R151-3j and R151-4j connected in parallel contributes to the setting of the time constant, the time constant is set larger than the set operation.

The circuit 152j turns off all of the transfer gates TG1 to TG3 in the read operation (second operation mode) in which application of the stress to the memory cell is needed the least. Therefore, because one equivalent resistor R151-4j contributes to the setting of the time constant, the time constant is set the largest.

Third Embodiment

A nonvolatile semiconductor storage device 1k according to the third embodiment is explained. In the followings, a portion different from the first embodiment and the second embodiment is mainly explained.

Figure 7:
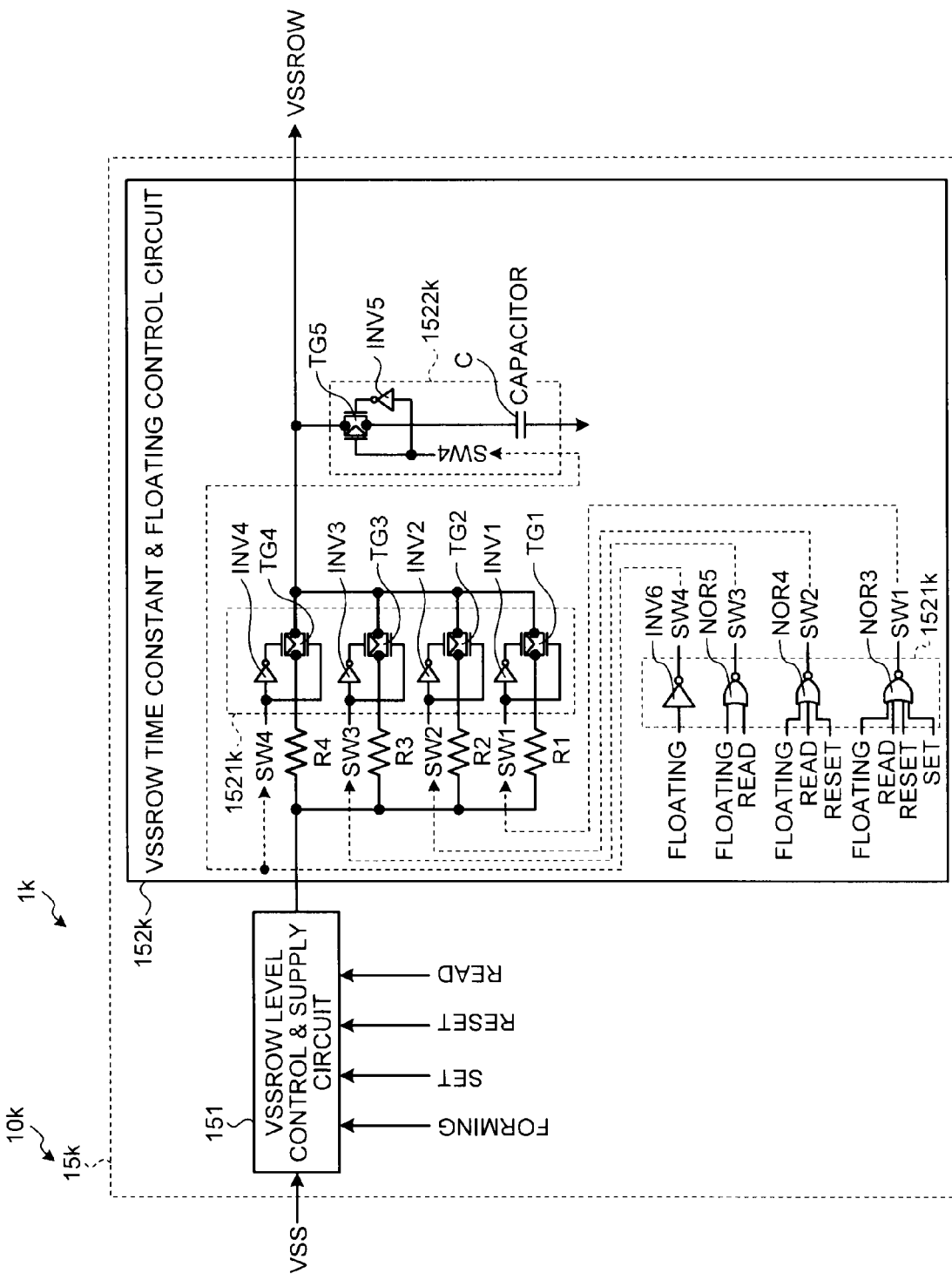
FIG. 7 is a diagram illustrating a configuration of a regulator circuit according to a third embodiment.

In the nonvolatile semiconductor storage device 1k, an internal configuration of a regulator circuit 15k in each row control circuit 10k is different from the first embodiment. FIG. 7 illustrates the internal configuration example of the regulator circuit 15k.

The regulator circuit 15k includes a circuit 152k that performs control of the time constant of the VSSROW and the control of floating. The circuit 152k switches between the following two operations to perform the switched operation. The first operation is an operation for transferring the voltage VSSROW to the WLDV driver 13 of the row decoder RD upon receiving the voltage VSSROW from the circuit 151 and connecting the resistive element for adjusting the time constant at discharging to the WLDV driver 13. The second operation is an operation for disconnecting the circuit 151 to the WLDV driver 13 and connecting, to the WLDV driver 13, one end of a capacitive element whose the other end is connected to the GND.

Specifically, the circuit 152k includes a selection circuit (connection circuit) 1521k and a floating setting circuit 1522k. In the circuit 152k, upon receiving a FLOATING signal, the SET signal, the RESET signal, and the READ signal from the mode control circuit, the following operation in accordance with these signals is performed. In the circuit 152k, in the first operation mode (forming operation and set operation), transfer of the voltage VSSROW and connection of the resistive element are performed by the selection circuit 1521k. In the circuit 152k, in the second operation mode (reset operation and read operation), disconnection by the selection circuit 1521k and connection of the capacitive element by the floating setting circuit 1522k are performed.

The mode control circuit, for example, sets the FLOATING signal such that it becomes the active level (for example, H level) if any of the RESET signal and the READ signal is at the active level (for example, H level) and outputs the signals to the circuit 152k.

More specifically, the selection circuit 1521k includes NOR gates NOR3 to NOR5, inverters INV6 and INV4, and a transfer gate TG4. The floating setting circuit 1522k includes a capacitive element C, an inverter INV5, and a transfer gate TG5.

Each of the NOR gates NOR3 to NOR5 performs the NOR operation of a signal in which the FLOATING signal is further added with respect to the logical gates NOR1 and NOR2, and the inverter INV0 in the second embodiment, and outputs the result thereof as the SW1 signal to the SW3 signal. The inverter INV6 performs the NOT operation of the FLOATING signal and outputs the result thereof to the inverter INV4, the transfer gate TG4, the inverter INV5, and the transfer gate TG5 as the SW4 signal.

The SW1 signal becomes the H level when all of the FLOATING signal, the READ signal, the RESET signal, and the SET signal are at the L level and becomes the L level in other cases. The SW2 signal becomes the H level when all of the FLOATING signal, the READ signal, and the RESET signal are at the L level and becomes the L level in other cases. The SW3 signal becomes the H level when both of the FLOATING signal and the READ signal are at the L level and becomes the L level in other cases. The transfer gate TG3 is turned on when the SW3 signal is at the H level to select the resistor R3 and connect the resistor R3 to the resistor R4 in parallel. The transfer gate TG3 is off when the SW3 signal is at the L level. The SW4 signal becomes the L level when the FLOATING signal is at the H level and becomes the H level when the FLOATING signal is at the L level.

The transfer gate TG4 is turned off when the SW4 signal is at the L level to disconnect the WLDV driver 13 from the circuit 151. The transfer gate TG4 is on when the SW4 signal is at the H level. The transfer gate TG5 is turned on when the SW4 signal is at the L level to connect the capacitive element C to the WLDV driver 13. The transfer gate TG5 is off when the SW4 signal is at the H level.

In this manner, the circuit 152k is different in the control by the FLOATING signal from the circuit 152i shown in FIG. 4.

When the FLOATING signal becomes H and the voltage VSSROW is to be switched to the floating state (for example, when any of the RESET signal and the READ signal is at the H level), all of the transfer gates TG1 to TG4 between the circuit 151 and the WLDV driver 13 are turned off and the transfer gate TG5 connected to the capacitive element C is turned on in the circuit 152k.

Figure 8:
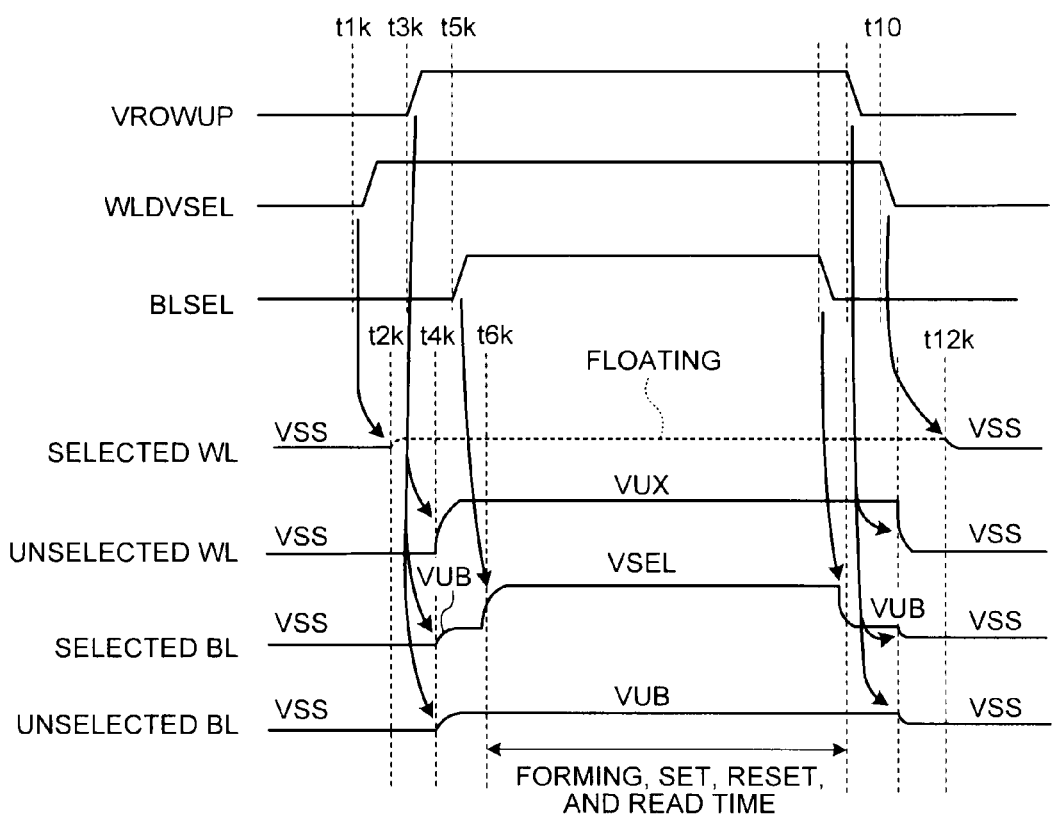
FIG. 8 is a waveform diagram illustrating an operation of a nonvolatile semiconductor storage device according to the third embodiment.

The operation of the nonvolatile semiconductor storage device 1k according to the third embodiment is explained with reference to FIG. 8. FIG. 8 illustrates a waveform in which the selected bit line BL is activated after the selected word line WL is activated. In FIG. 8, as the operation waveform of the selected word line WL, the waveform in the operation mode (second operation mode (for example, reset operation and read operation)) in which the selected BL is made floating is illustrated. The operation waveform in the first operation mode (for example, forming operation and set operation) is not illustrated in FIG. 8 since it is similar to the first embodiment (operation waveform of the "selected WL" in FIG. 3). In the followings, a portion different from the operation shown in FIG. 3 is mainly explained.

At a timing t1k, a desired word line WL is selected by the row address signal and the WLDVSEL signal is switched from L to H.

At a timing t2k, in response to a situation that the WLDVSEL signal is switched to H, the selected word line WL is selectively set to the floating state. Specifically, although the WLDV signal output from the WLDV driver 13 (see FIG. 1) in the selected word line WL is switched from control of the VROW to control of the VSSROW by switching the WLDVSEL signal from L to H, the VSS is supplied to the VROW in the initial state, so that the selected word line WL is switched from the VSS to the floating state.

At a timing t3k, the operation similar to that at the timing t1 shown in FIG. 3 is performed. At a timing t4k, the operation similar to that at the timing t2 shown in FIG. 3 is performed. At a timing t5k, the operation similar to that at the timing t3 shown in FIG. 3 is performed.

At a timing t6k, the operation similar to that at the timing t4 shown in FIG. 3 is performed. In other words, the selected bit line BL is selectively raised to the voltage (first selection voltage) VSEL that is equal to or larger than the threshold voltage Vth of the diode D. Whereby, because it is possible to utilizing the property that current flows from the selected bit line BL to the selected word line WL via the selected memory cell MC, the selected word line WL can be in a level floating more than the ground voltage VSS.

At a timing t2k, in response to a situation that the WLDVSEL signal of the selected row has been switched from H to L (switched at the timing t10), the selected word line WL is selectively returned from the floating state to the state in which the ground voltage VSS is applied.

As above, according to the third embodiment, either of the first operation and the second operation are performed by switching between them in accordance with the operation mode where the nonvolatile semiconductor storage device 1k operates detected from among the plurality of operation modes (forming operation, reset operation, set operation, and read operation). In the first operation, the operation similar to the first embodiment or the second embodiment is performed. In the second operation, the selected word line is set to the floating state before charging the selected bit line to the selection voltage VSEL. Whereby, it is possible to apply, as an appropriate stress in accordance with the operation mode, a differential voltage between the selection voltage VSSROW or the voltage in the floating state and the selection voltage VSEL to the memory cell that is arranged at the position where the selected bit line intersects with the selected word line. In this manner, the cell access operation such as the forming operation, the set operation, the reset operation, and the read operation can be performed by applying the stress close to an ideal stress with respect to any selected memory cell.

In other words, the operation modes include the first operation mode (forming operation and set operation) in which application of the stress to the memory cell is required and the second operation mode (reset operation and read operation) in which application of the stress to the memory cell is not required. The row control circuit 10 of the selected row discharges the selected word line to the selection voltage (second selection voltage) VSSROW (see FIG. 3) in the first operation mode and causes the selected word line to be in the floating state in the second operation mode. Whereby, in the first operation mode (forming operation and set operation) in which application of the stress to the memory cell is required, sufficient stress can be applied to the memory cell. Consequently, the memory cell can be switched to a sufficiently low resistance state. Moreover, in the second operation mode (reset operation and read operation) in which application of the stress to the memory cell is not required, application of excess stress to the memory cell can be suppressed. Consequently, since incorrect switching of the memory cell into the low-resistance state can be reduced, it is possible to keep the memory cell from storing incorrect information.

It is applicable that the row control circuit 10 of the selected row discharges the selected word line to the ground voltage VSS instead of discharging the selected word line to the selection voltage VSSROW in the first operation mode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device having a plurality of operation modes, comprising:
   a plurality of first lines;
   a plurality of second lines that intersect with the plurality of first lines;
   a plurality of memory cells arranged at positions where the first lines intersect with the second lines, each memory cell including a variable resistive element and a rectifying element that is connected to the variable resistive element in series;
   a first selection unit that charges a first line to be selected from among the plurality of first lines to a first selection voltage; and
   a second selection unit that charges a second line to be selected from among the plurality of second lines to an unselection voltage and discharges the second line to be selected to a second selection voltage after the first line to be selected is charged to the first selection voltage by the first selection unit, wherein
   the second selection unit adjusts at least one of a level of the second selection voltage to which the second line to be selected is to be discharged and a time constant when discharging the second line to be selected, in accordance with an operation mode in which the nonvolatile semiconductor storage device operates among the plurality of operation modes.

2. The nonvolatile semiconductor storage device according to claim 1, wherein
   the operation modes include a first operation mode in which application of a stress to the memory cell is required and a second operation mode in which application of a stress to the memory cell is not required, and
   the second selection unit performs, in the second operation mode, at least one of an operation of adjusting the level of the second selection voltage to be close to a level of the unselection voltage compared with the first operation mode and an operation of adjusting to cause the time constant to be large compared with the first operation mode.

3. The nonvolatile semiconductor storage device according to claim 2, wherein
   the second selection unit includes, for each of the second lines, a level control circuit that adjusts the level of the second selection voltage in accordance with the operation mode in which the nonvolatile semiconductor storage device operates, and
   the level control circuit adjusts such that the level of the second selection voltage in the second operation mode becomes close to the level of the unselection voltage compared with the first operation mode.

4. The nonvolatile semiconductor storage device according to claim 3, wherein
   the level control circuit, upon receiving a reference voltage having a reference level lower than the unselection voltage, generates the second selection voltage by shifting the level of the reference voltage received in the first operation mode to a level lower than the reference level, and generates the second selection voltage by shifting the level of the reference voltage received in the second operation mode to a level between the reference level and the level of the unselection voltage.

5. The nonvolatile semiconductor storage device according to claim 3, wherein
   the first operation mode includes a forming operation mode and a set operation mode,
   the second operation mode includes a reset operation mode and a read operation mode, and
   the level control circuit adjusts the level of the second selection voltage in the set operation mode to be close to the level of the unselection voltage compared with the forming operation mode, adjusts the level of the second selection voltage in the reset operation mode to be close to the level of the unselection voltage compared with the set operation mode, and adjusts the level of the second selection voltage in the read operation mode to be close to the level of the unselection voltage compared with the reset operation mode.

6. The nonvolatile semiconductor storage device according to claim 5, wherein
   the level control circuit, upon receiving a reference voltage having a reference level lower than the unselection voltage, generates the second selection voltage by shifting the level of the reference voltage received in the forming operation mode or the set operation mode to a level lower than the reference level, and generates the second selection voltage by shifting the level of the reference voltage received in the reset operation mode or the read operation mode to a level between the reference level and the level of the unselection voltage.

7. The nonvolatile semiconductor storage device according to claim 3, wherein
the first operation mode includes a forming operation mode and a set operation mode,
the second operation mode includes a reset operation mode and a read operation mode, and
the level control circuit, upon receiving a reference voltage having a reference level lower than the unselection voltage, generates the second selection voltage by shifting the level of the reference voltage received in the forming operation mode or the set operation mode to a level lower than the reference level, and generates the second selection voltage by shifting the level of the reference voltage received in the reset operation mode or the read operation mode to a level between the reference level and the level of the unselection voltage.

8. The nonvolatile semiconductor storage device according to claim 2, wherein
the second selection unit includes for each of the second lines
a plurality of resistors, and
a selection circuit that selects at least one resistor to be used when discharging the second line to be selected from among the resistors, and
wherein the selection circuit selects the at least one resistor to be used such that a combined resistance of resistors selected in the second operation mode becomes larger than a combined resistance of resistors selected in the first operation mode.

9. The nonvolatile semiconductor storage device according to claim 8, wherein
the plurality of resistors are connected with each other in parallel, and
the selection circuit changes number of the resistors to be used such that number of the resistors selected in the second operation mode becomes smaller than number of the resistors selected in the first operation mode.

10. The nonvolatile semiconductor storage device according to claim 8, wherein
the first operation mode includes a forming operation mode and a set operation mode,
the second operation mode includes a reset operation mode and a read operation mode, and
wherein the selection circuit selects the at least one resistor to be used such that a combined resistance of resistors selected in the set operation mode becomes larger than a combined resistance of resistors selected in the forming operation mode, selects the at least one resistor to be used such that a combined resistance of resistors selected in the reset operation mode becomes larger than the combined resistance of the resistors selected in the set operation mode, and selects the at least one resistor to be used such that a combined resistance of resistors selected in the read operation mode becomes larger than the combined resistance of the resistors selected in the reset operation mode.

11. The nonvolatile semiconductor storage device according to claim 10, wherein
the resistors are connected with each other in parallel, and
the selection circuit selects the at least one resistor to be used such that number of the resistors selected in the set operation mode becomes smaller than number of the resistors selected in the forming operation mode, selects the at least one resistor to be used such that number of the resistors selected in the reset operation mode becomes smaller than the number of the resistors selected in the set operation mode, and selects the at least one resistor to be used such that number of the resistors selected in the read operation mode becomes smaller than the number of the resistors selected in the reset operation mode.

12. The nonvolatile semiconductor storage device according to claim 8, wherein
the plurality of resistors include a plurality of resistive elements.

13. The nonvolatile semiconductor storage device according to claim 8, wherein
the second selection unit includes, for each of the second lines, a plurality of level control circuits, each level control circuit adjusting the level of the second selection voltage in accordance with the operation mode in which the nonvolatile semiconductor storage device operates,
the plurality of resistors are equivalent resistors of the level control circuits, and
the selection circuit selects at least one level control circuit to be used when discharging the second line to be selected from among the plurality of level control circuits.

14. The nonvolatile semiconductor storage device according to claim 1, wherein
the plurality of first lines are a plurality of word lines each extending in a direction along a row,
the plurality of second lines are a plurality of bit lines each extending in a direction along a column, and
wherein, in each of the memory cells, the variable resistive element and the rectifying element are electrically connected between the bit line and the word line such that a forward bias is applied to the rectifying element when a voltage of the bit line is set higher than a voltage of the word line.

15. The nonvolatile semiconductor storage device according to claim 1, wherein
the plurality of first lines are a plurality of bit lines each extending in a direction along a column,
the plurality of second lines are a plurality of word lines each extending in a direction along a row, and
wherein, in each of the memory cells, the variable resistive element and the rectifying element are electrically connected between the word line and the bit line such that a forward bias is applied to the rectifying element when a voltage of the word line is set higher than a voltage of the bit line.

16. A nonvolatile semiconductor storage device having a plurality of operation modes, comprising:
a plurality of first lines;
a plurality of second lines that intersect with the plurality of first lines;
a plurality of memory cells arranged at positions at which the first lines intersect with the second lines, each memory cell including a variable resistive element and a rectifying element that is connected to the variable resistive element in series;
a first selection unit that charges a first line to be selected from among the plurality of first lines to a first selection voltage; and
a second selection unit that performs an operation for selecting a second line to be selected from among the plurality of second lines in accordance with an operation mode in which the nonvolatile semiconductor storage device operates among the plurality of operation modes by switching between a first operation and a second operation, wherein
in the first operation, the second selection unit charges the second line to be selected to an unselection voltage, and the second selection unit discharges the second line to be selected to a second selection voltage after the first line to be selected is charged to the first selection voltage by the first selection unit, and in the second operation, the second selection unit causes the second line to be selected from among the second lines to be in a floating state before the first line to be selected is charged to the first selection voltage by the first selection unit.

17. The nonvolatile semiconductor storage device according to claim 16, wherein the operation modes include a first operation mode in which application of a stress to the memory cell is needed and a second operation mode in which application of a stress to the memory cell is not needed, and the second selection unit performs the first operation in the first operation mode and performs the second operation in the second operation mode.

18. The nonvolatile semiconductor storage device according to claim 17, wherein the second selection unit includes for each of the second lines a supply circuit that supplies the second selection voltage, a connection circuit that connects the supply circuit to the second line in the first operation mode and disconnects the supply circuit from the second line in the second operation mode, and a floating setting circuit that includes a capacitive element, disconnects the capacitive element from the second line in the first operation mode, and connects the capacitive element to the second line in the second operation mode.

19. The nonvolatile semiconductor storage device according to claim 18, wherein the first operation mode includes a forming operation mode and a set operation mode, the second operation mode includes a reset operation mode and a read operation mode, the supply circuit includes a level control circuit that adjusts a level of the second selection voltage in accordance with the operation mode in which the nonvolatile semiconductor storage device operates, and the level control circuit adjusts the level of the second selection voltage such that the level of the second selection voltage in the set operation mode becomes close to a level of the unselection voltage compared with the forming operation mode.

20. The nonvolatile semiconductor storage device according to claim 18, wherein the first operation mode includes a forming operation mode and a set operation mode, the second operation mode includes a reset operation mode and a read operation mode, the connection circuit includes a plurality of resistors, and a selection circuit that selects at least one resistor to be used when discharging the second line to be selected from among the resistors, and the selection circuit selects the at least one resistor to be used such that a combined resistance of resistors selected in the set operation mode becomes larger than a combined resistance of resistors selected in the forming operation mode.

* * * * *